United States Patent
Rhodes et al.

(10) Patent No.: US 6,787,819 B2
(45) Date of Patent: *Sep. 7, 2004

(54) RETROGRADE WELL STRUCTURE FOR A CMOS IMAGER

(75) Inventors: Howard E. Rhodes, Boise, ID (US); Mark Durcan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/295,952

(22) Filed: Nov. 18, 2002

(65) Prior Publication Data

US 2003/0173572 A1 Sep. 18, 2003

Related U.S. Application Data

(60) Continuation of application No. 09/918,450, filed on Aug. 1, 2001, now Pat. No. 6,483,129, which is a division of application No. 09/334,261, filed on Jun. 16, 1999, now Pat. No. 6,310,366.

(51) Int. Cl.[7] .............................................. H01L 31/109
(52) U.S. Cl. ....................... 257/185; 257/431; 257/655
(58) Field of Search ................................ 257/185, 431, 257/655, 917

(56) References Cited

U.S. PATENT DOCUMENTS

| | | | |
|---|---|---|---|
| 4,374,700 A | 2/1983 | Scott et al. |
| 4,963,973 A | 10/1990 | Watanabe et al. |
| 5,150,177 A | 9/1992 | Robinson et al. |
| 5,151,385 A | 9/1992 | Yamamoto et al. |
| 5,268,316 A | 12/1993 | Robinson et al. |
| 5,293,237 A | 3/1994 | Yonemoto |
| 5,319,604 A | 6/1994 | Imondi et al. |
| 5,428,239 A | 6/1995 | Okumura et al. |
| 5,461,425 A | 10/1995 | Fowler et al. |
| 5,471,515 A | 11/1995 | Fossum et al. |
| 5,541,402 A | 7/1996 | Ackland et al. |
| 5,576,763 A | 11/1996 | Ackland et al. |
| 5,608,243 A | 3/1997 | Chi et al. |
| 5,614,744 A | 3/1997 | Merrill |
| 5,625,210 A | 4/1997 | Lee et al. |
| 5,705,846 A | 1/1998 | Merrill |
| 5,708,263 A | 1/1998 | Wong |
| 5,747,840 A | 5/1998 | Merrill |
| 5,757,045 A | 5/1998 | Tsai et al. |
| 5,773,863 A | 6/1998 | Burr et al. |
| 5,814,866 A | 9/1998 | Borland |
| 6,147,366 A | 11/2000 | Drotter et al. |
| 6,150,683 A | 11/2000 | Merrill et al. |
| 6,268,250 B1 | 7/2001 | Helm |

FOREIGN PATENT DOCUMENTS

JP      2-178864 A      7/1990

OTHER PUBLICATIONS

Fossum, E., *Low Power Camera–on–a–Chip Using CMOS Active Pixel Sensor Technology*, 1995 IEEE, pps. 74–77.

(List continued on next page.)

*Primary Examiner*—Allan R. Wilson
(74) *Attorney, Agent, or Firm*—Dickstein Shapiro Morin & Oshinsky LLP

(57) ABSTRACT

A retrograde well structure for a CMOS imager that improves the quantum efficiency and signal-to-noise ratio of the imager. The retrograde well comprises a doped region with a vertically graded dopant concentration that is lowest at the substrate surface, and highest at the bottom of the well. A single retrograde well may have a single pixel sensor cell, multiple pixel sensor cells, or even an entire array of pixel sensor cells formed therein. The highly concentrated region at the bottom of the retrograde well repels signal carriers from the photosensor so that they are not lost to the substrate, and prevents noise carriers from the substrate from diffusing up into the photosensor. Also disclosed are methods for forming the retrograde well.

33 Claims, 8 Drawing Sheets

OTHER PUBLICATIONS

Fossum, E., *Architectures for focal plane image processing*, Optical Engineering, vol. 28, No. 8, Aug. 1989, pps. 865–871.

Janesick, J., et al., *New advancements in charge–coupled device technology sub–electron noise and 4096×4096 pixel CCDs*, SPIE vol. 1242, 1990, pps. 223–237.

Kemeny, S.E., et al., *Update on focal–plane image processing research*, Proc. SPIE vol. 1447, 1991, pps. 243–250.

Mendis, S., et al., *CMOS Active Pixel Image Sensor*, IEEE Transactions on Electron Devices, vol. 41, No. 3, Mar. 1994, pps. 452–453.

Mendis, S.K., et al., *A 128 ×128 CMOS Active Pixel Image Sensor for Highly Integrated Imaging Systems*, 1993 IEEE, pps. 583–586.

Mendis, S.K., et al., *CMOS Active Pixel Image Sensors for Highly Integrated Imaging Systems*, IEEE Journal of Solid-State Circuits, vol. 32, No. 2, Feb. 1997, pps. 187–197.

Mendis, S.K., et al., *Design of a Low–Light–Level Image Sensor with On–Chip Sigma–Delta Analog–to–Digital Conversion*, Proc. SPIE vol. 1900, Jul. 1993, pps. 31–39.

Mendis, S.K., et al., *Low–Light–Level Image Sensor with On–Chip Signal Processing*, Proc. SPIE vol. 1952, Nov. 1993, pps. 23–33.

Mendis, S.K., et al., *Progress In CMOS Active Pixel Image Sensors*, Proc. SPIE vol. 2172, May 1994, pps. 19–29.

Nixon, R.H., et al., *256 ×256 CMOS Active Pixel Sensor Camera–on–a–Chip*, IEEE Journal of Solid–State Circuits, vol. 31, No. 12, Dec. 1996, pps.2046–2050.

Nixon, R.H., et al., *256×256 CMOS Active Pixel Sensor Camera–on–a–Chip*, 1996 IEEE International Solid–State Circuits Conference, pps. 178–179.

Panicacci, R., et al., *Programmable multiresolution CMOS active pixel sensor*, Proc. SPIE vol. 2654, Mar. 1996, pps. 72–79.

Panicacci, R.A., et al., *128Mb/s Multiport CMOS Binary Active–Pixel Image Sensor*, 1996 IEEE International Solid-State Circuit Conference, pps. 100–101.

Yadid–Pecht, O., et al., *CMOS Active Pixel Sensor Star Tracker with Regional Electronic Shutter*, IEEE Journal of Solid–State Circuits, vol. 32, No. 2, Feb. 1997, pps. 285–288.

Yadid–Pecht, O., et al., *Wide dynamic range APS star tracker*, Proc. SPIE vol. 2654, Mar. 1996, pps. 82–92.

Zarnowshi, J., et al., *Imaging options expand with CMOS technology*, Laser Focus World, Jun. 1997, pps. 125–130.

Zhou, Z., et al., *A Cmos Imager with On–Chip Variable Resolution for Light–Adaptive Imaging*, 1998 IEEE International Solid–State Circuits Conferenc, pps. 174–175.

Zhou, Z., et al., *A Digital CMOS Active Pixel Image Sensor For Multimedia Applications*, Proc. SPIE vol. 2894, Sep. 1996, pps. 282–288.

Fossum, E., et al., *IEDM A 37×28mm$^2$ 600k–Pixel CMOS APS Dental X–Ray Camera–on–a–Chip with Self–Triggered Readout*, 1998 IEEE International Solid–State Circuits Conference, pps. 172–173.

RETROGRADE WELL STRUCTURE FOR A CMOS IMAGER

This application is a continuation of U.S. patent application Ser. No. 09/918,450, filed Aug. 1, 2001, now U.S. Pat. No. 6,489,129 which is a divisional of U.S. patent application Ser. No. 09/334,261, filed Jun. 16, 1999, now U.S. Pat. No. 6,310,366 entitled Retrograde Well Structure For CMOS Imager, each of which is herein incorporated by reference in its entirety.

FIELD OF THE INVENTION

The present invention relates generally to improved semiconductor imaging devices and in particular to a silicon imaging device that can be fabricated using a standard CMOS process.

BACKGROUND OF THE INVENTION

There are a number of different types of semiconductor-based imagers, including charge coupled devices (CCDs), photodiode arrays, charge injection devices and hybrid focal plane arrays. CCD technology is often employed for image acquisition and enjoys a number of advantages which makes it the incumbent technology, particularly for small size imaging applications. CCDs are capable of large formats with small pixel size and they employ low noise charge domain processing techniques.

However, CCD imagers also suffer from a number of disadvantages. For example, they are susceptible to radiation damage, they exhibit destructive read-out over time, they require good light shielding to avoid image smear and they have a high power dissipation for large arrays. Additionally, while offering high performance, CCD arrays are difficult to integrate with CMOS processing in part due to a different processing technology and to their high capacitances, complicating the integration of on-chip drive and signal processing electronics with the CCD array. While there have been some attempts to integrate on-chip signal processing with CCD arrays, these attempts have not been entirely successful. CCDs also must transfer an image by line charge transfers from pixel to pixel, requiring that the entire array be read out into a memory before individual pixels or groups of pixels can be accessed and processed. This takes time. CCDs may also suffer from incomplete charge transfer from pixel to pixel which results in image smear.

Because of the inherent limitations in CCD technology, there is an interest in CMOS imagers for possible use as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

The advantages of CMOS imagers over CCD imagers are that CMOS imagers have a low voltage operation and low power consumption; CMOS imagers are compatible with integrated on-chip electronics (control logic and timing, image processing, and signal conditioning such as A/D conversion); CMOS imagers allow random access to the image data; and CMOS imagers have lower fabrication costs as compared with the conventional CCD because standard CMOS processing techniques can be used. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the underlying portion of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

CMOS imagers of the type discussed above are generally known as discussed, for example, in Nixon et al., "256×256 CMOS Active Pixel Sensor Camera-on-a-Chip," IEEE Journal of Solid-State Circuits, Vol. 31(12), pp. 2046–2050 (1996); Mendis et al., "CMOS Active Pixel Image Sensors," IEEE Transactions on Electron Devices, Vol. 41(3), pp. 452–453 (1994), as well as U.S. Pat. Nos. 5,708,263 and 5,471,515, which are herein incorporated by reference.

To provide context for the invention, an exemplary CMOS imaging circuit is described below with reference to FIG. 1. The circuit described below, for example, includes a photogate for accumulating photo-generated charge in an underlying portion of the substrate. It should be understood that the CMOS imager may include a photodiode or other image to charge converting device, in lieu of a photogate, as the initial accumulator for photo-generated charge.

Reference is now made to FIG. 1 which shows a simplified circuit for a pixel of an exemplary CMOS imager using a photogate and having a pixel photodetector circuit 14 and a readout circuit 60. It should be understood that while FIG. 1 shows the circuitry for operation of a single pixel, that in practical use there will be an M×N array of pixels arranged in rows and columns with the pixels of the array accessed using row and column select circuitry, as described in more detail below.

The photodetector circuit 14 is shown in part as a cross-sectional view of a semiconductor substrate 16 typically a p-type silicon, having a surface well of p-type material 20. An optional layer 18 of p-type material may be used if desired, but is not required. Substrate 16 may be formed of, for example, Si, SiGe, Ge, or GaAs. Typically the entire substrate 16 is p-type doped silicon substrate and may contain a surface p-well 20 (with layer 18 omitted), but many other options are possible, such as, for example p on p− substrates, p on p+ substrates, p-wells in n-type substrates or the like. The terms wafer or substrate used in the description includes any semiconductor-based structure having an exposed surface in which to form the circuit structure used in the invention. Wafer and substrate are to be understood as including silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a wafer or substrate in the following description, previous process steps may have been utilized to form regions/junctions in the base semiconductor structure or foundation.

An insulating layer 22 such as, for example, silicon dioxide is formed on the upper surface of p-well 20. The p-type layer may be a p-well formed in substrate 16. A photogate 24 thin enough to pass radiant energy or of a material which passes radiant energy is formed on the insulating layer 22. The photogate 24 receives an applied control signal PG which causes the initial accumulation of pixel charges in n+ region 26. The n+ type region 26, adjacent one side of photogate 24, is formed in the upper surface of p-well 20. A transfer gate 28 is formed on insulating layer 22 between n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. It is also a node for passing charge accumulated thereat to the gate of a source follower transistor 36 described below.

A reset gate 32 is also formed on insulating layer 22 adjacent and between n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source $V_{DD}$, e.g., 5 volts. The transfer and reset transistors 29, 31 are n-channel transistors as described in this implementation of a CMOS imager circuit in a p-well. It should be understood that it is possible to implement a CMOS imager in an n-well in which case each of the transistors would be p-channel transistors. It should also be noted that while FIG. 1 shows the use of a transfer gate 28 and associated transistor 29, this structure provides advantages, but is not required.

Photodetector circuit 14 also includes two additional n-channel transistors, source follower transistor 36 and row select transistor 38. Transistors 36, 38 are coupled in series, source to drain, with the source of transistor 36 also coupled over lead 40 to voltage source $V_{DD}$ and the drain of transistor 38 coupled to a lead 42. The drain of row select transistor 38 is connected via conductor 42 to the drains of similar row select transistors for other pixels in a given pixel row. A load transistor 39 is also coupled between the drain of transistor 38 and a voltage source $V_{SS}$, e.g. 0 volts. Transistor 39 is kept on by a signal $V_{LN}$ applied to its gate.

The imager includes a readout circuit 60 which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage $V_{SS}$. The upper side of the capacitor 64 is also connected to the gate of a p-channel output transistor 66. The drain of the output transistor 66 is connected through a column select transistor 68 to a signal sample output node $V_{OUTS}$ and through a load transistor 70 to the voltage supply $V_{DD}$. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage $V_{SS}$. The upper side of the capacitor 74 is also connected to the gate of a p-channel output transistor 76. The drain of the output transistor 76 is connected through a p-channel column select transistor 78 to a reset sample output node $V_{OUTR}$ and through a load transistor 80 to the supply voltage $V_{DD}$. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by reset transistor 31 and then of the stored charge from the photogate 24. The two samplings of the diffusion node 30 charges produce respective output voltages $V_{OUTR}$ and $V_{OUTS}$ of the readout circuit 60. These voltages are then subtracted ($V_{OUTS}-V_{OUTR}$) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in the manner shown by element 14 of FIG. 1. FIG. 4 shows a 2×2 portion of pixel array 200. Pixel array 200 comprises a plurality of pixels arranged in a predetermined number of columns and rows. The pixels of each row in array 200 are all turned on at the same time by a row select line, e.g., line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of photodetector circuit 14 of the FIG. 1 CMOS imager. The photogate signal PG is nominally set to 5V and pulsed from 5V to 0V during integration. The reset signal RST is nominally set at 2.5V. As can be seen from the figure, the process is begun at time $t_0$ by briefly pulsing reset voltage RST to 5V. The RST voltage, which is applied to the gate 32 of reset transistor 31, causes transistor 31 to turn on and the floating diffusion node 30 to charge to the $V_{DD}$ voltage present at n+ region 34 (less the voltage drop $V_{TH}$ of transistor 31). This resets the floating diffusion node 30 to a predetermined voltage ($V_{DD}$-$V_{TH}$). The charge on floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72 which charges capacitor 74 with the source follower transistor output voltage on line 42 representing the reset charge present at floating diffusion node 30. The PG signal is next pulsed to 0 volts, causing charge to be collected in n+ region 26.

A transfer gate voltage TX, similar to the reset pulse RST, is then applied to transfer gate 28 of transistor 29 to cause the charge in n+ region 26 to transfer to floating diffusion node 30. It should be understood that for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

The operation of the charge collection of the CMOS imager is known in the art and is described in several publications such as Mendis et al., "Progress in CMOS Active Pixel Image Sensors," SPIE Vol. 2172, pp. 19–29 (1994); Mendis et al., "CMOS Active Pixel Image Sensors for Highly Integrated Imaging Systems," IEEE Journal of Solid State Circuits, Vol. 32(2) (1997); and Eric R Fossum, "CMOS Image Sensors: Electronic Camera on a Chip," IEDM Vol. 95, pp. 17–25 (1995) as well as other publications. These references are incorporated herein by reference.

Quantum efficiency is a problem in some imager applications due to the diffusion of signal carriers out of the photosite and into the substrate, where they become effectively lost. The loss of signal carriers results in decreased signal strength, increased cross talk, and the reading of an improper value for the adjacent pixels.

There is needed, therefore, an improved pixel sensor cell for use in an imager that exhibits improved quantum efficiency, a better signal-to-noise ratio, and reduced cross talk. A method of fabricating a pixel sensor cell exhibiting these improvements is also needed.

SUMMARY OF THE INVENTION

The present invention provides a pixel sensor cell formed in a retrograde well in a semiconductor substrate having improved quantum efficiency, an improved signal-to-noise ratio, and reduced cross talk. The retrograde well comprises a doped region with a vertically graded dopant concentration that is lowest at the substrate surface, and highest at the bottom of the well. The retrograde well would have an entire array of pixels formed therein, and may also have peripheral circuitry formed therein. If the peripheral circuitry is formed in the retrograde well, the well may have a different dopant profile in the peripheral region than in the array region. The highly concentrated region at the bottom of the retrograde well reflects signal carriers back to the photosensor so that they are not lost to the substrate. Also provided are methods for forming a pixel sensor cell in the retrograde well of the present invention.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide. For exemplary purposes an imager formed of n-channel devices in a retrograde p-well is illustrated and described, but it should be understood that the invention is not limited thereto, and may include other combinations such as an imager formed of p-channel devices in a retrograde n-well.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Figure 5:
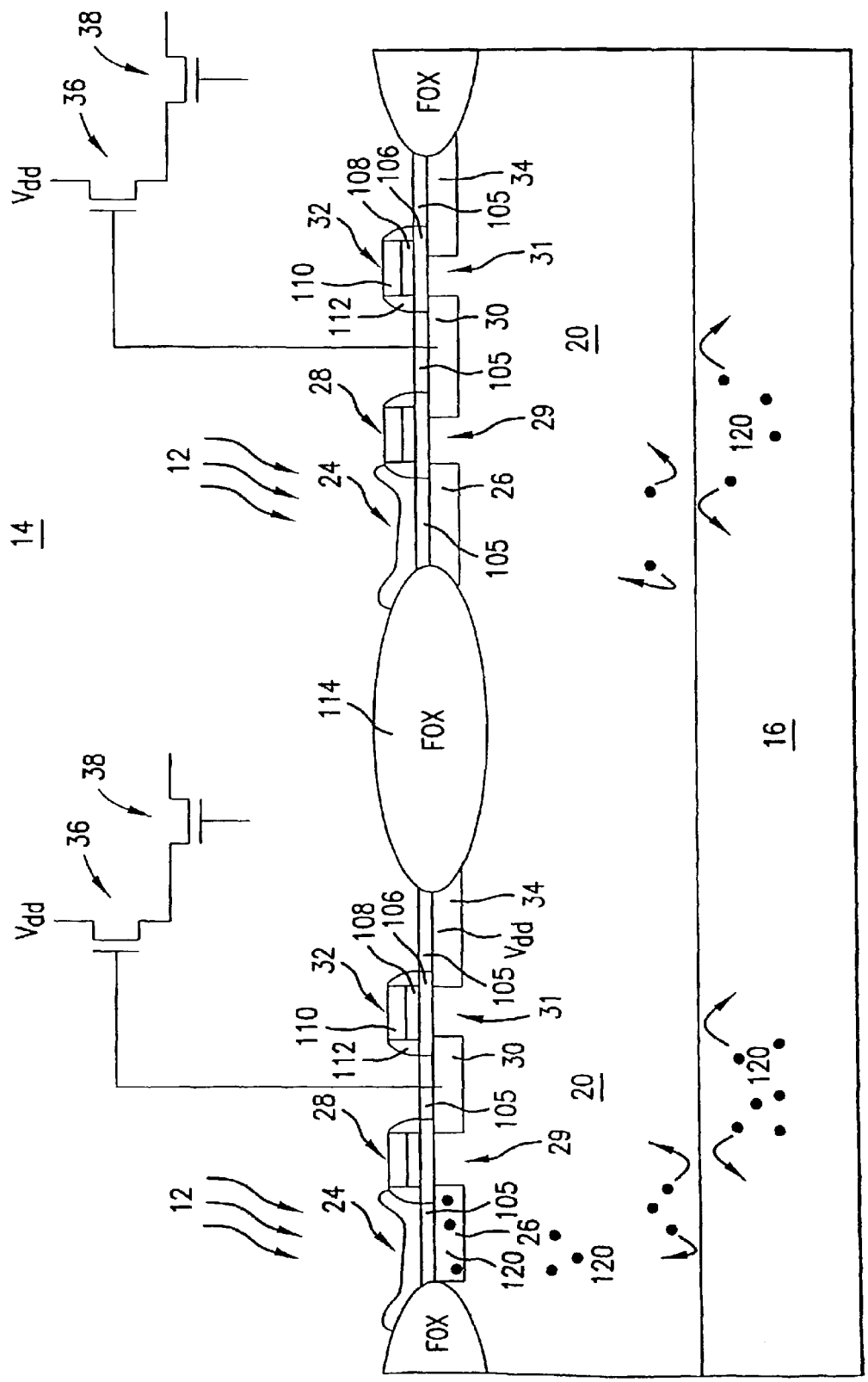
FIG. 5 is a cross-sectional view of two pixel sensor cells according to an embodiment of the present invention.
Figure 6:
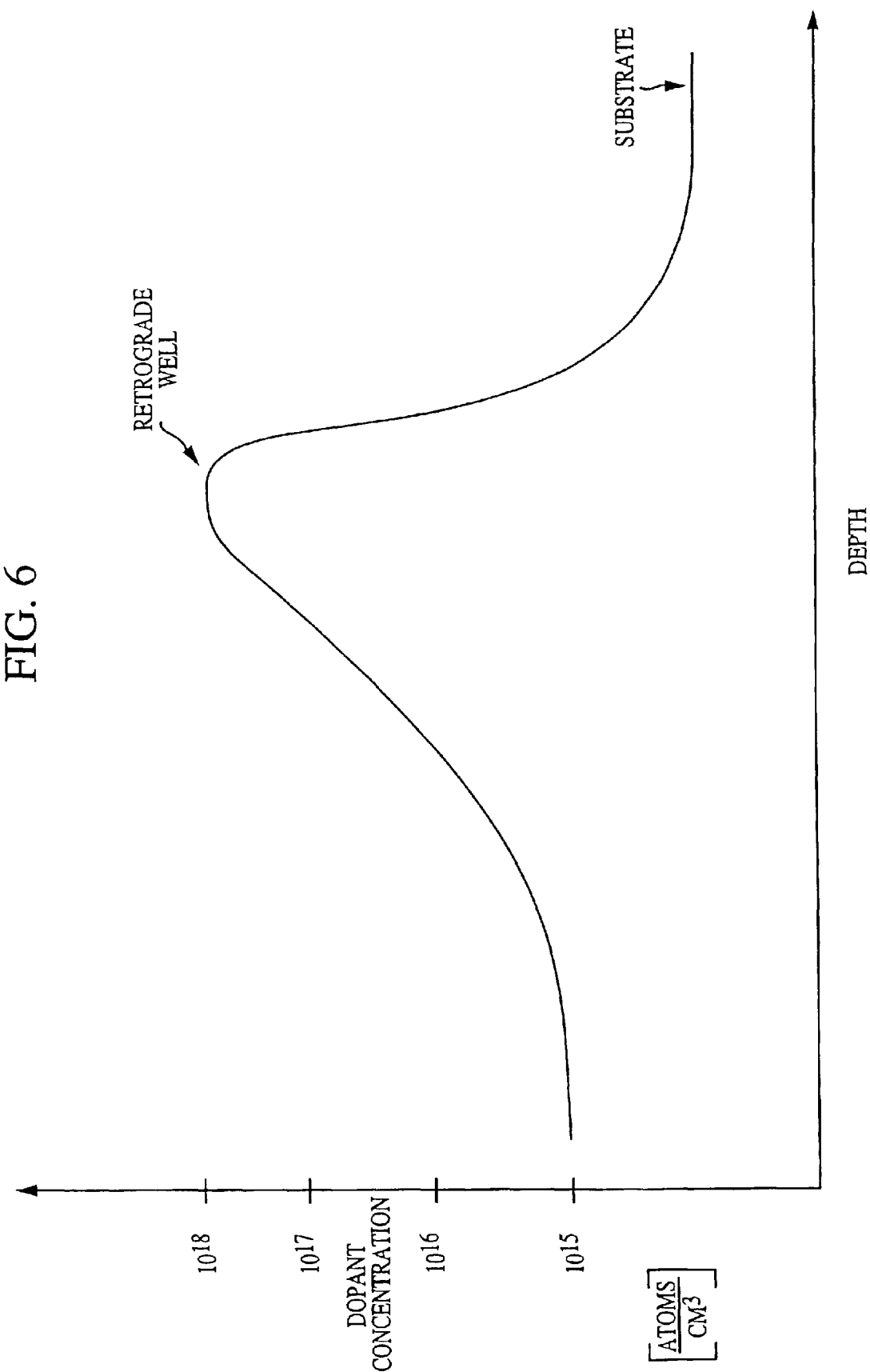
FIG. 6 is a graph depicting the dopant concentration as a function of the depth of the retrograde well.

The structure of pixel cells 14 formed in retrograde wells 20 of the first embodiment are shown in more detail in FIG. 5. A pixel cell 14 may be formed in a substrate 16 having a retrograde layer or well 20 of a first conductivity type, which for exemplary purposes is treated as p-type. The retrograde well 20 has a vertically graded dopant concentration that is lowest at the substrate surface, and highest at the bottom of the well, as is shown in FIG. 6. The dopant concentration at the top of the retrograde well 20 is within the range of about $5 \times 10^{14}$ to about $1 \times 10^{17}$ atoms per cm$^3$, and is preferably within the range of about $1 \times 10^{15}$ to about $5 \times 10^{16}$ atoms per cm$^3$, and most preferably is about $5 \times 10^{15}$ atoms per cm$^3$. At the bottom of the retrograde well 20, the dopant concentration is within the range of about $1 \times 10^{16}$ to about $2 \times 10^{18}$ atoms per cm$^3$, and is preferably within the range of about $5 \times 10^{16}$ to about $1 \times 10^{18}$ atoms per cm$^3$, and most preferably is about $3 \times 10^{17}$ atoms per cm$^3$. A single retrograde well 20 as depicted in FIG. 5, spans all pixels in the array of pixels.

A second retrograde well (not shown) may be formed in the substrate 16, and may have peripheral circuitry, such as, e.g., logic circuitry, formed therein. This second well may be doped similarly or differently from the first retrograde well 20, for example, the first retrograde well 20 may be doped to a first dopant level such as about $3 \times 10^{17}$ atoms per cm$^3$ at the bottom of the well and the second well may be doped to a second dopant level such as $5 \times 10^{16}$ at the bottom of the well.

The transistor gates form the pixel cell 14 as shown: a photogate 24, a transfer gate 28 for transfer transistor 29, and a reset transistor gate 32 for the reset transistor 31. In addition, the photosensitive element in the pixel cell 14 is shown to be a photogate 24, but other photosensitive elements such as a photodiode or a photoconductor could be used. The source follower transistor and the row select transistor are not shown. The transfer gate 28 and the reset gate 32 include a gate oxide layer 106 on the retrograde well 20, and a conductive layer 108 of doped polysilicon, tungsten, or other suitable material over the gate oxide layer 106. An insulating cap layer 110 of, for example, silicon dioxide, silicon nitride, or ONO (oxide-nitride-oxide), may be formed if desired; also a more conductive layer such as a silicide layer (not shown) may be used between the conductive layer 108 and the cap 110 of the transfer gate stack 28, source follower gate, row select gate, and reset gate stack 32, if desired. Insulating sidewalls 112 are also formed on the sides of the gate stacks 28, 32. These sidewalls may be formed of, for example, silicon dioxide or silicon nitride or ONO. The transfer gate is not required but may advantageously be included. The photogate 24 is a semitransparent conductor and is shown as an overlapping gate. In this case there is a second gate oxide 105 over the retrograde well and under the photogate.

Underlying the photogate 24 is a doped region 26 called the photosite, where photogenerated charges are stored. In between the reset transistor gate 32 and the transfer gate 28 is a doped region 30 that is the source for the reset transistor 31, and on the other side of the reset transistor gate 32 is a doped region 34 that acts as a drain for the reset transistor 31. The doped regions 26, 30, 34 are doped to a second conductivity type, which for exemplary purposes is treated as n-type. The second doped region 30 is the floating diffusion region, sometimes also referred to as a floating diffusion node, and it serves as the source for the reset transistor 31. The third doped region 34 is the drain of the reset transistor 31, and is also connected to voltage source Vdd.

As shown in FIG. 5, as light radiation 12 in the form of photons strikes the photosite 26, photo-energy is converted to electrical signals, i.e., carriers 120, which are stored in the photosite 26. The absorption of light creates electron-hole pairs. For the case of an n-doped photosite in a p-well, it is the electrons that are stored. For the case of a p-doped photosite in an n-well, it is the holes that are stored. In the exemplary pixel cell 14 having n-channel devices formed in a p-type retrograde well 20, the carriers 120 stored in the photosite 26 are electrons. The retrograde well 20 acts to reduce carrier loss to the substrate 16 by forming a concentration gradient that modifies the band diagram and serves to reflect electrons back towards the photosite 26, thereby increasing quantum efficiency of the pixel 14.

Figure 7:
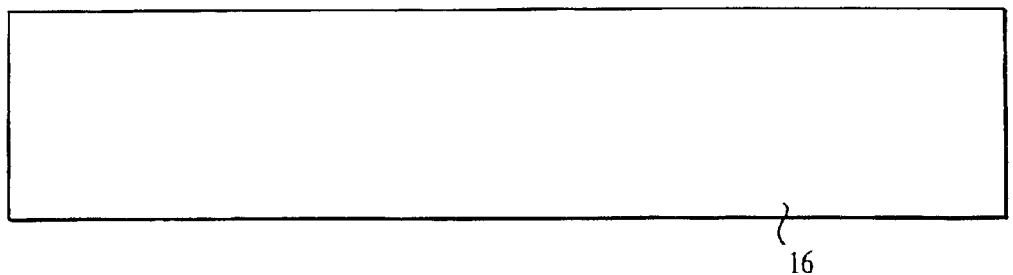
FIG. 7 is a cross-sectional view of a semiconductor wafer undergoing the process of a preferred embodiment of the invention.
Figure 8:
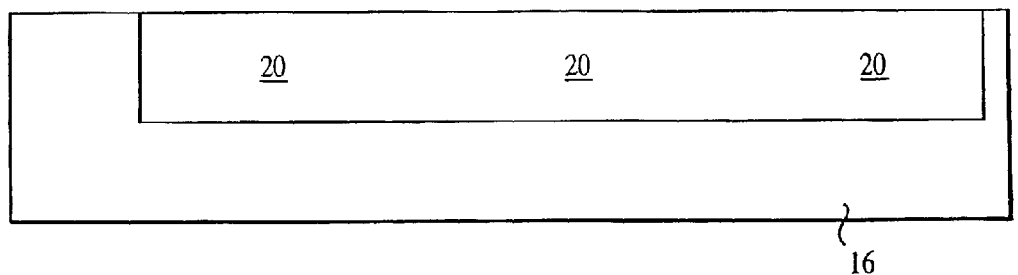
FIG. 8 shows the wafer of FIG. 7 at a processing step subsequent to that shown in FIG. 7.

The retrograde well 20 is manufactured through a process described as follows, and illustrated by FIGS. 7 and 8. Referring now to FIG. 7, a substrate 16, which may be any of the types of substrates described above, is provided. Retrograde well 20 is then formed by suitable means such as blanket ion implantation of the entire wafer. The retrograde well 20 may be implanted at a later stage of the process such as after field oxide formation. The implant may be patterned so that the array well and the periphery logic well could have different doping profiles.

Ion implantation is performed by placing the substrate 16 in an ion implanter, and implanting appropriate dopant ions into the substrate 16 at an energy of 100 keV to 5 MeV to form retrograde wells 20 having a dopant concentration that is lowest at the surface, and highest at the bottom of the well. The dopant concentration at the top of the retrograde well 20 is within the range of about $5 \times 10^{14}$ to about $1 \times 10^{17}$ atoms per cm$^3$, and is preferably within the range of about $1 \times 10^{15}$ to about $5 \times 10^{16}$ atoms per cm$^3$, and most preferably is about $5 \times 10^{15}$ atoms per cm$^3$. At the bottom of the retrograde well 20, the dopant concentration is within the range of about $1 \times 10^{16}$ to about $2 \times 10^{18}$ atoms per cm$^3$, and is preferably within the range of about $5 \times 10^{16}$ to about $1 \times 10^{18}$ atoms per cm$^3$, and most preferably is about $3 \times 10^{17}$ atoms per cm$^3$. If the retrograde well is to be a p-type well, a p-type dopant, such as boron, is implanted, and if the well 20 is to be an n-type well, an n-type dopant, such as arsenic, antimony, or phosphorous is implanted. The resultant structure is shown in FIG. 8. Multiple high energy implants may be used to tailor the profile of the retrograde well 20.

Figure 9:
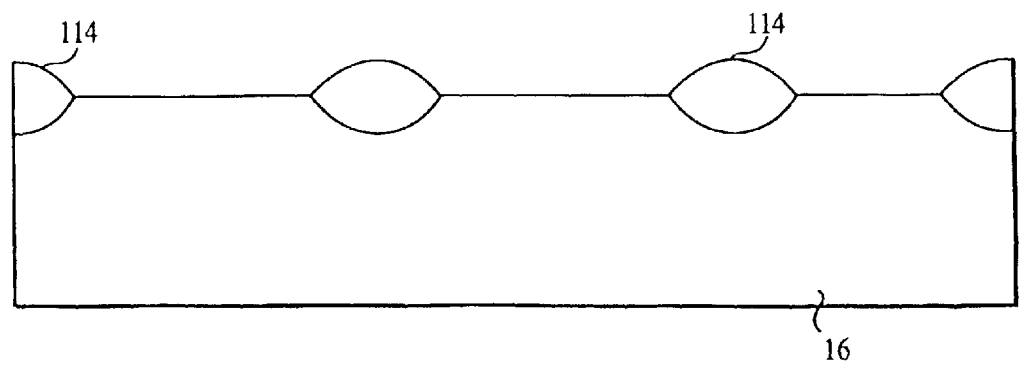
FIG. 9 is a cross-sectional view of a semiconductor wafer undergoing the process of a second embodiment of the invention.
Figure 10:
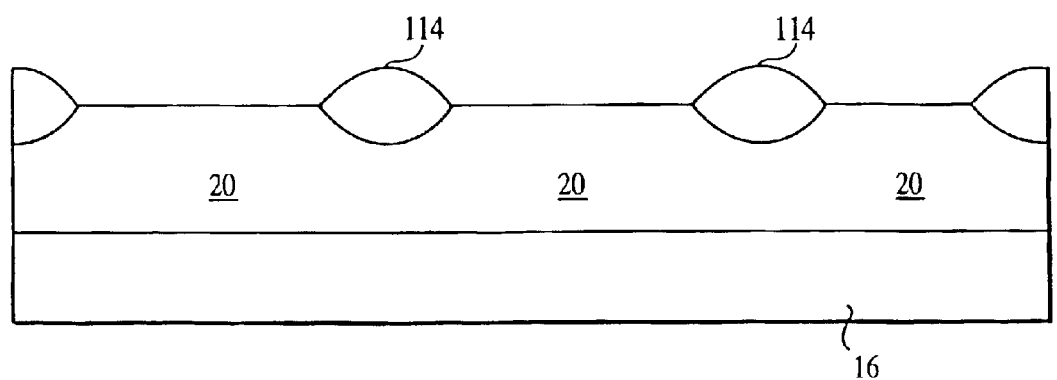
FIG. 10 shows the wafer of FIG. 9 at a processing step subsequent to that shown in FIG. 9.

Referring now to FIGS. 9 and 10, field oxide regions 114 may be formed around the pixel cell 14 prior to the formation of the retrograde well 20. The field oxide regions are formed by any known technique such as thermal oxidation of the underlying silicon in a LOCOS process or by etching trenches and filling them with oxide in an STI process. Following field oxide 114 formation, the retrograde wells 20 may then be formed by blanket implantation as shown in FIG. 10 or by masked implantation (not shown).

Subsequent to formation of the retrograde well 20, the devices of the pixel sensor cell 14, including the photogate 24, the transfer gate 28, reset transistor 31, the source follower 36 and the row select transistor 38 are formed by well-known methods. Doped regions 26, 30, and 34 are formed in the retrograde well 20, and are doped to a second conductivity type, which for exemplary purposes will be considered to be n-type. The doping level of the doped regions 26, 30, 34 may vary but should be higher than the doping level at the top of the retrograde well 20, and greater than $5 \times 10^{16}$ atoms per cm$^3$. If desired, multiple masks and resists may be used to dope these regions to different levels. Doped region 26 may be variably doped, such as either n+ or n− for an n-channel device. Doped region 34 should be strongly doped, i.e., for an n-channel device, the doped region 34 will be doped as n+. Doped region 30 is typically strongly doped (n+), and would not be lightly doped (n−) unless a buried contact is also used.

Figure 1:
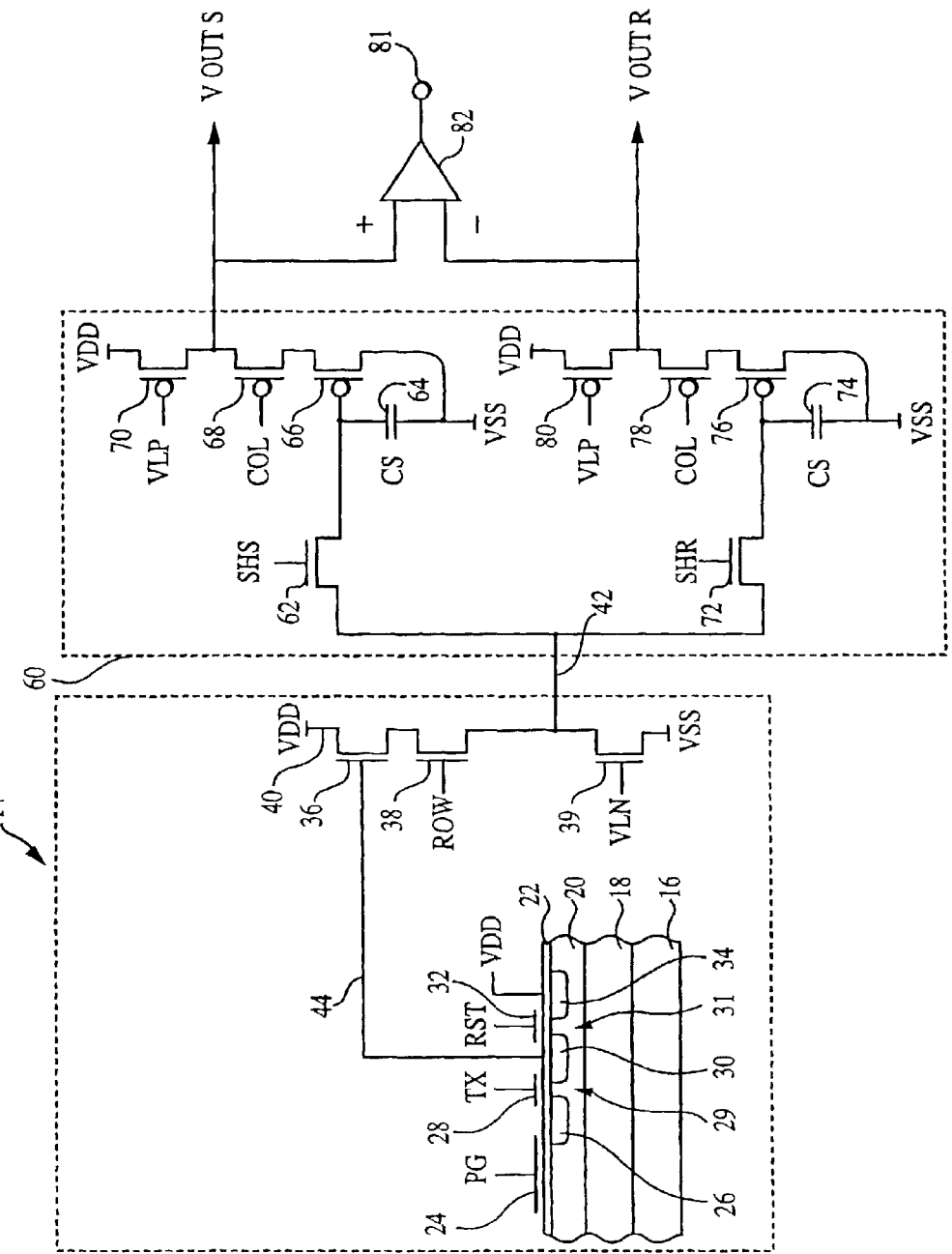
FIG. 1 is a representative circuit of a CMOS imager.
Figure 2:
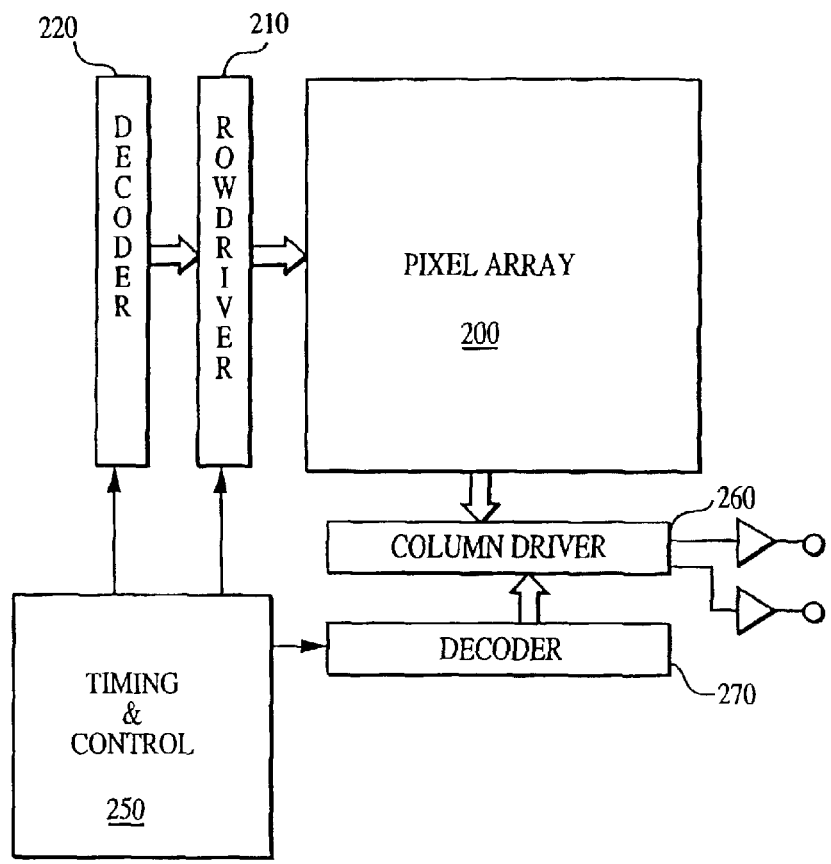
FIG. 2 is a block diagram of a CMOS pixel sensor chip.
Figure 3:
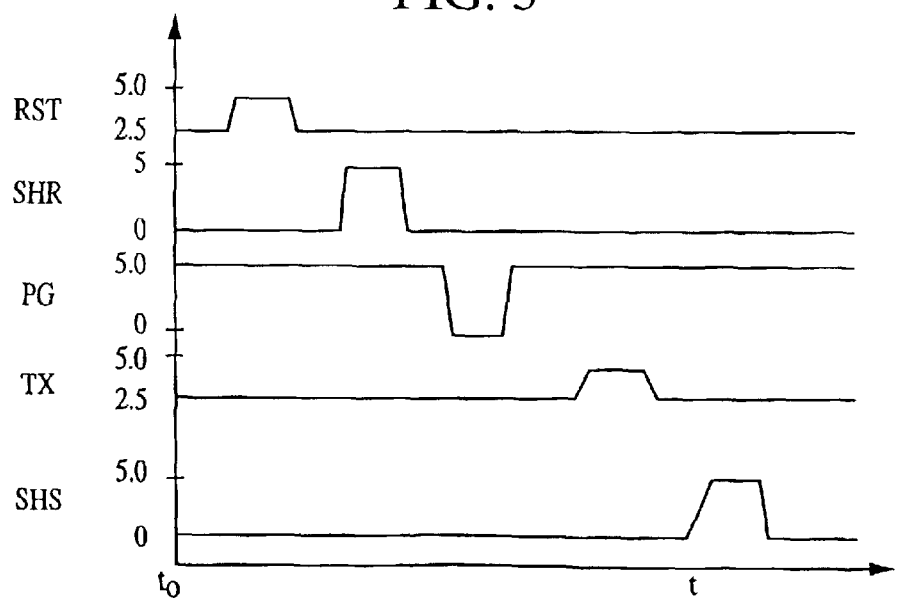
FIG. 3 is a representative timing diagram for the CMOS imager.
Figure 4:
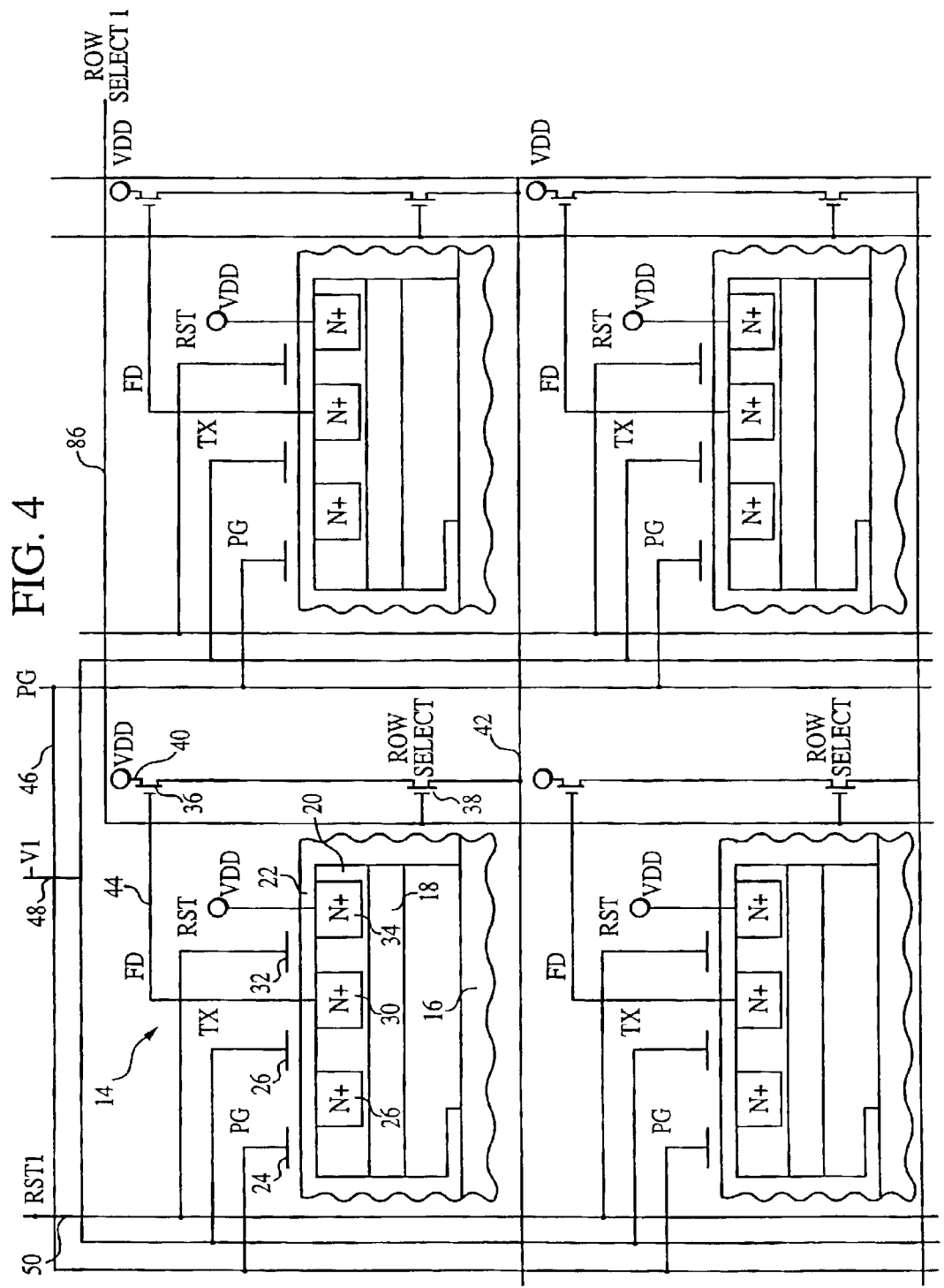
FIG. 4 is a representative pixel layout showing a 2×2 pixel layout.

The pixel sensor cell 14 is essentially complete at this stage, and conventional processing methods may be used to form contacts and wiring to connect gate lines and other connections in the pixel cell 14. For example, the entire surface may then be covered with a passivation layer of, e.g., silicon dioxide, BSG, PSG, or BPSG, which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

Figure 11:
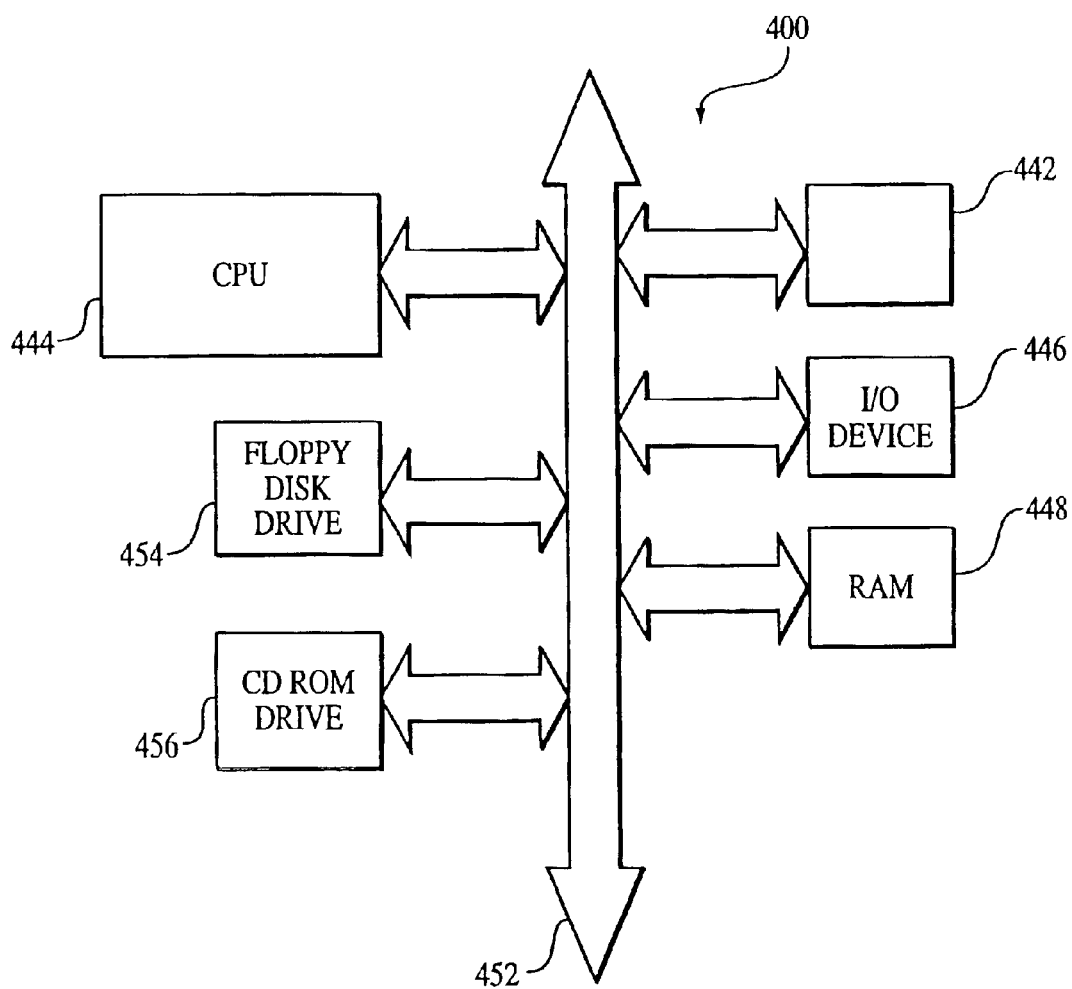
FIG. 11 is an illustration of a computer system having a CMOS imager according to the present invention.

A typical processor based system which includes a CMOS imager device according to the present invention is illustrated generally at 400 in FIG. 11. A processor based system is exemplary of a system having digital circuits which could include CMOS imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 444, e.g., a microprocessor, that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes pixels containing a photosensor such as a photogate or photodiode formed in a retrograde well, as previously described with respect to FIGS. 5 through 10. The CMOS imager 442 may be combined with a processor, such as a CPU, digital signal processor or microprocessor, with or without memory storage in a single integrated circuit, or may be on a different chip than the processor.

As can be seen by the embodiments described herein, the present invention encompasses a pixel sensor cell formed in a retrograde well. The pixel sensor cell has improved quantum efficiency and an improved signal-to-noise ratio due to the presence of a doping gradient induced electric field created in the bottom of the retrograde well which reflects signal carriers back to the photosensitive node. By reflecting photogenerated carriers back to the storage node the retrograde p-well also reduces the number of carriers diffusing to adjacent pixels and so also reduces cross talk.

It should again be noted that although the invention has been described with specific reference to CMOS imaging circuits having a photogate and a floating diffusion region, the invention has broader applicability and may be used in any CMOS imaging apparatus. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A pixel sensor cell for an imaging device, said pixel sensor cell comprising:
    a retrograde well of a first conductivity type formed in a substrate, wherein said retrograde well has a vertically graded dopant of said first conductivity type between a bottom of said retrograde well having a highest concentration of said dopant of said first conductivity type and a top of said retrograde well; and
    a photosensitive region formed in said retrograde well.

2. The pixel sensor cell of claim 1, wherein the first conductivity type is p-type.

3. The pixel sensor cell of claim 2, wherein said retrograde well is doped with boron.

4. The pixel sensor cell of claim 1, wherein the first conductivity type is n-type.

5. The pixel sensor cell of claim 4, wherein said retrograde well is doped with a dopant selected from the group consisting of arsenic, antimony, and phosphorous.

6. The pixel sensor cell of claim 1, wherein said retrograde well has a dopant concentration within the range of about $1 \times 10^{16}$ to about $2 \times 10^{18}$ atoms per cm$^3$ at the bottom of said retrograde well.

7. The pixel sensor cell of claim 6, wherein said retrograde well has a dopant concentration within the range of about $5 \times 10^{14}$ to about $1 \times 10^{17}$ atoms per cm$^3$ at the top of said retrograde well.

8. The pixel sensor cell of claim 1, wherein said retrograde well has a dopant concentration within the range of about $5 \times 10^{16}$ to about $1 \times 10^{18}$ atoms per cm$^3$ at the bottom of said retrograde well.

9. The pixel sensor cell of claim 8, wherein said retrograde well has a dopant concentration within the range of about $1 \times 10^{15}$ to about $5 \times 10^{16}$ atoms per cm$^3$ at the top of said retrograde well.

10. The pixel sensor cell of claim 1, wherein said retrograde well has a dopant concentration of about $3 \times 10^{17}$ atoms per cm$^3$ at the bottom of said retrograde well.

11. The pixel sensor cell of claim 10, wherein said retrograde well has a dopant concentration of about $5 \times 10^{15}$ atoms per cm$^3$ at the top of said retrograde well.

12. The pixel sensor cell of claim 1, further comprising a photosensor formed on said photosensitive region for controlling the collection of charges in said photosensitive region.

13. The pixel sensor cell of claim 12, wherein said photosensor is a photodiode sensor.

14. The pixel sensor cell of claim 12, wherein said photosensor is a photogate sensor.

15. The pixel sensor cell of clam 12, wherein said photosensor is a photoconductor sensor.

16. The pixel sensor cell of claim 1, further comprising a transfer gate formed on said retrograde well adjacent to said photosensor.

17. The pixel sensor cell of claim 1, wherein said photosensitive region comprises a doped region of a second conductivity type.

18. A pixel sensor cell for an imaging device, said pixel sensor cell comprising:
- a retrograde well of a first conductivity type formed in a substrate;
- a photosensor formed in said retrograde well;
- a reset transistor having a gate stack formed in said retrograde well;
- a floating diffusion region of a second conductivity type formed in said retrograde well between said photosensor and reset transistor for receiving charges from said photosensor, said reset transistor operating to periodically reset a charge level of said floating diffusion region; and
- an output transistor having a gate electrically connected to said floating diffusion region.

19. The pixel sensor cell of claim 18, wherein said photosensor further comprises a doped region of a second conductivity type located in said retrograde well.

20. The pixel sensor cell of claim 18, wherein said photosensor is a photodiode sensor.

21. The pixel sensor cell of claim 18, wherein said photosensor is a photoconductor sensor.

22. The pixel sensor cell of claim 18, further comprising a transfer gate located between said photosensor and said floating diffusion region.

23. The pixel sensor cell of claim 22, wherein said photosensor is a photogate sensor.

24. The pixel sensor cell of claim 18, wherein the first conductivity type is p-type, and the second conductivity type is n-type.

25. The pixel sensor cell of claim 24, wherein said retrograde well is doped with boron.

26. The pixel sensor cell of claim 18, wherein the first conductivity type is n-type, and the second conductivity type is p-type.

27. The pixel sensor cell of claim 26, wherein said retrograde well is doped with a dopant selected from the group consisting of arsenic, antimony, and phosphorous.

28. The pixel sensor cell of claim 18, wherein said retrograde well has a dopant concentration within the range of about $1\times10^{16}$ to about $2\times10^{18}$ atoms per $cm^3$ at the bottom of said retrograde well.

29. The pixel sensor cell of claim 28, wherein said retrograde well has a dopant concentration within the range of about $5\times10^{14}$ to about $1\times10^{17}$ atoms per $cm^3$ at the top of said retrograde well.

30. The pixel sensor cell of claim 18, wherein said retrograde well has a dopant concentration within the range of about $5\times10^{16}$ to about $1\times10^{18}$ atoms per $cm^3$ at the bottom of said retrograde well.

31. The pixel sensor cell of claim 30, wherein said retrograde well has a dopant concentration within the range of about $1\times10^{15}$ to about $5\times10^{16}$ atoms per $cm^3$ at the top of said retrograde well.

32. The pixel sensor cell of claim 18, wherein said retrograde well has a dopant concentration of about $3\times10^{17}$ atoms per $cm^3$ at the bottom of said retrograde well.

33. The pixel sensor cell of claim 30, wherein said retrograde well has a dopant concentration of about $5\times10^{15}$ atoms per $cm^3$ at the top of said retrograde well.

* * * * *

UNITED STATES PATENT AND TRADEMARK OFFICE
CERTIFICATE OF CORRECTION

PATENT NO. : 6,787,819 B2
DATED : September 7, 2004
INVENTOR(S) : Howard E. Rhodes et al.

It is certified that error appears in the above-identified patent and that said Letters Patent is hereby corrected as shown below:

Title page,
Item [56], References Cited, OTHER PUBLICATIONS,
"Janesick, J., et al. ..." reference, "CCD's, SPIE" should read -- CCD's, Proc. SPIE --

Column 1,
Line 6, "No. 6,489,129" should read -- No. 6,483,129 --

Signed and Sealed this

Seventeenth Day of May, 2005

JON W. DUDAS
*Director of the United States Patent and Trademark Office*